(12) United States Patent
Wasson

(10) Patent No.: US 6,321,352 B1
(45) Date of Patent: Nov. 20, 2001

(54) INTEGRATED CIRCUIT TESTER HAVING A DISK DRIVE PER CHANNEL

(75) Inventor: Will Wasson, Livermore, CA (US)

(73) Assignee: Credence Systems Corporation, Fremont, CA (US)

( * ) Notice: Subject to any disclaimer, the term of this patent is extended or adjusted under 35 U.S.C. 154(b) by 0 days.

(21) Appl. No.: 09/181,946

(22) Filed: Oct. 28, 1998

(51) Int. Cl.[7] .................................................. G01R 31/28
(52) U.S. Cl. ............................................ 714/724; 324/765
(58) Field of Search .................................. 714/724, 742, 714/6, 44, 48, 32, 723, 700, 730, 736; 324/73.1, 765, 601, 158.1, 763; 707/531; 345/333, 335; 711/167, 111; 710/5; 360/31

(56) References Cited

U.S. PATENT DOCUMENTS

| | | | |
|---|---|---|---|
| 4,497,056 | * | 1/1985 | Sugamori .............................. 714/736 |
| 4,994,732 | * | 2/1991 | Jeffrey et al. ........................ 324/73.1 |
| 5,225,772 | * | 7/1993 | Cheung et al. ...................... 324/73.1 |
| 5,737,512 | * | 4/1998 | Proudfoot ............................... 714/32 |
| 5,970,073 | * | 10/1999 | Masuda et al. ....................... 371/27.1 |
| 6,076,179 | * | 6/2000 | Hendricks et al. ................... 714/742 |
| 6,181,151 | * | 1/2001 | Wasson ................................. 324/765 |

OTHER PUBLICATIONS

Lin et al., (Multi–Chip Single Package 32 Bit Floating Point Digital Signal Processor with Built–in 64 K–Byte SRAM Cache Memory; IEEE, May 1989).*

Kiamiley et al., (Design of a 64–Bit, 100 MIPS Microprocessor Core IC for Hybrid CMOS–SEED Technology; IEEE, Oct. 1996).*

Vea et al. (A Soft Error Rate Model for Predicting Off–Track Performance; IEEE, Jan. 1995).*

Thakkar et al., (Performance of an OLTP Application on Symmetry Multiprocessor System; IEEE, May 1990).*

* cited by examiner

Primary Examiner—Albert Decady
Assistant Examiner—Guy Lamarre
(74) Attorney, Agent, or Firm—Daniel J. Bedell; Smith-Hill and Bedell

(57) ABSTRACT

An integrated circuit (IC) tester includes set of tester channels, each for carrying out a test activity at a separate terminal of an IC device under test (DUT) during each cycle of a test. Each tester channel includes a disk for storing several instruction sets, each including instructions and control data defining a separate test. To set up the tester for a test, a host computer sends a command to each channel identifying the instruction set to be used. Each channel then executes the instructions of the identified set during the test. Each channel also includes a high-speed instruction memory that can read out instructions at a higher rate than the disk. Before starting a test, each channel moves instructions covering high-speed portions of the test from the disk to the instruction memory. Thereafter, during those high-speed portions of the test in which instructions must be read out and executed at a high rate, each channel acquires those instructions from its instruction memory. During low-speed portions of the test, each channel acquires instructions to be executed directly from the disk.

13 Claims, 2 Drawing Sheets

INTEGRATED CIRCUIT TESTER HAVING A DISK DRIVE PER CHANNEL

BACKGROUND OF THE INVENTION

1. Field of the Invention

Figure 1:
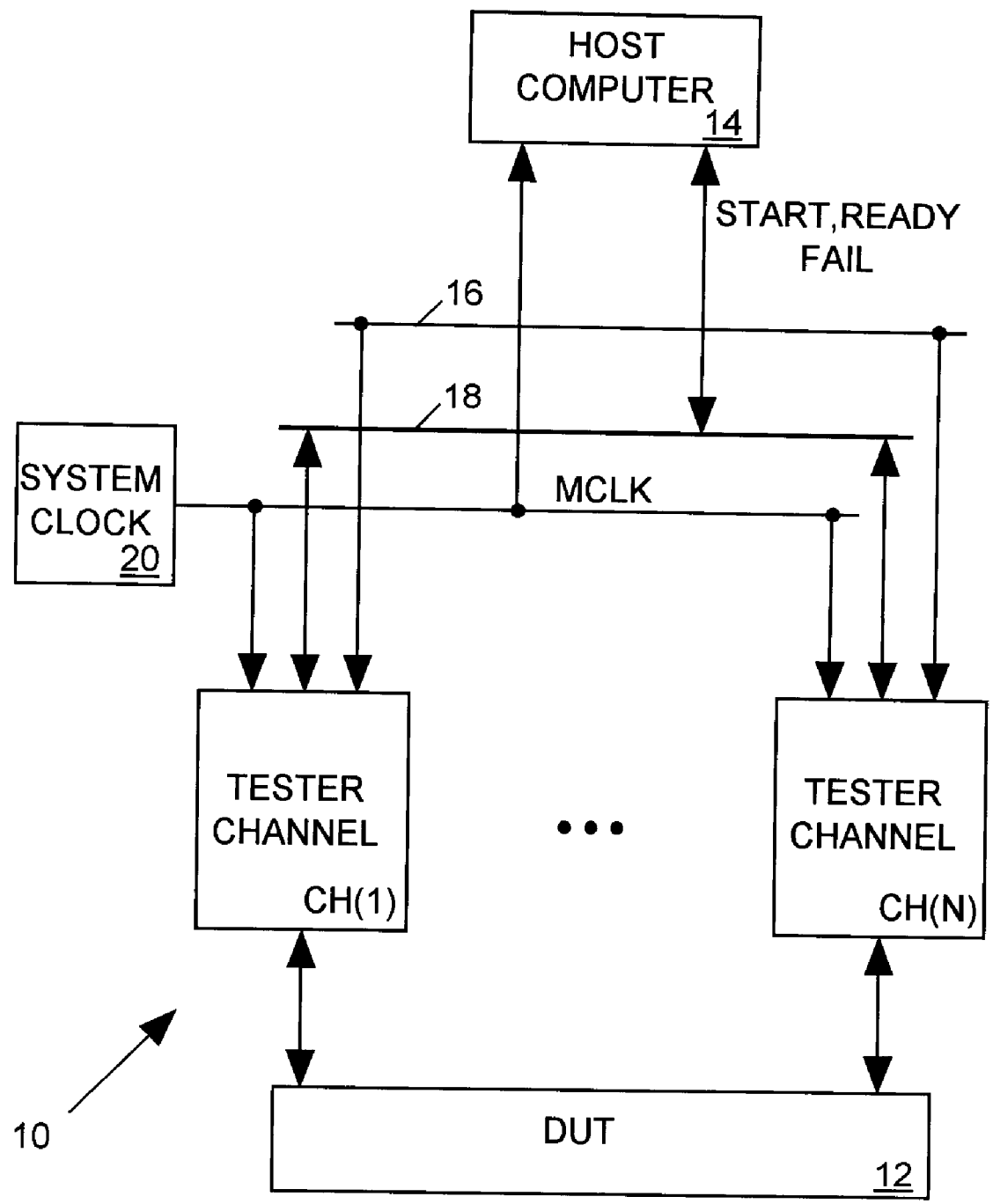

The present invention relates in general to integrated circuit (IC) testers of the type having a separate channel accessing each terminal of an IC being tested, and in particular to a tester that includes a disk drive in each channel as a source of test instructions.

2. Description of Related Art

A typical "per-pin" integrated circuit (IC) tester includes a separate channel for each terminal of an IC to be tested. Each channel includes a vector memory, a sequencer, a formatting circuit and a pin electronics circuit. The IC tester organizes a test into a succession of test cycles. Before the test, a host computer writes a sequence of vectors (data values) into successive addresses of the vector memory. Each vector defines the test activities the formatting and pin electronics circuits are to carry out during a test cycle. Such activities may include setting a test signal input to the DUT terminal to a particular state at a particular time during the test cycle or sampling a DUT output signal appearing at the DUT terminal at a particular time to determine if it is of an expected state. Before each test cycle the sequencer signals the vector memory to read out a vector to tell the formatting and pin electronics circuits what to do during the test cycle.

As ICs and the manner in which they are tested become more complex, the number of cycles per test increases, thereby increasing the size of the vector data sequence that must be stored in the channel's vector memories. Large high-speed vector memories are expensive. Also since it takes more time for a host computer to write a large vector sequence into the vector memory of each channel, the time required to program testers has increased. When a tester has to frequently alternate between two or more different tests, the time required to reprogram the tester limits its throughput.

What is needed is a tester having channels capable of economically storing large amounts of test instructions and which are capable of quickly switching from one type of test to another without requiring extensive reprogramming time.

SUMMARY OF THE INVENTION

An integrated circuit (IC) tester in accordance with the invention includes set of tester channels, each for carrying out a test activity at a separate terminal of an IC device under test (DUT) during each cycle of a test. In accordance with one aspect of the invention, each tester channel includes a disk drive for storing several instruction sets, each including instructions defining a separate test. To configure the tester for performing any one of those tests, a host computer sends a command to each channel identifying the instruction set for that test. Each channel then executes the instructions of the identified set during the test. The host computer may then configure the tester to carry out another one of the tests by commanding the channels to execute another instruction set stored in their disk drives. Since the host computer can configure each channel to perform a test without having to provide the channel with a complete set of instructions from a central source, the tester can quickly switch from one test to another.

In accordance with another aspect of the invention, each channel includes a high-speed instruction memory that can read out instructions at a higher rate than the channel's disk drive. When the host computer commands each channel to execute a set of test instructions stored in its disk drive, the channel moves instructions covering high-speed portions of the test from the disk drive to the instruction memory before the test begins. Thereafter, during portions of the test in which instructions must be read out and executed at a high rate, the channel acquires those instructions from the instruction memory. During portions of the test in which instructions may be executed at a low rate, the channel acquires the instructions to be executed directly from the disk drive. Thus the tester is able to perform tests having a large number of test cycles without having to provide an expensive high-speed instruction memory large enough to hold all needed instructions. The instruction memory need only be large enough to hold the instructions needed for the high-speed portions of the test.

It is accordingly an object of the invention to provide an IC tester having channels capable of economically storing large amounts of test instructions.

It is another object of the invention to provide an IC tester capable of quickly switching from one type of test to another without requiring extensive reprogramming time.

The concluding portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawing(s) wherein like reference characters refer to like elements.

BRIEF DESCRIPTION OF THE DRAWING(S)

Figure 2:
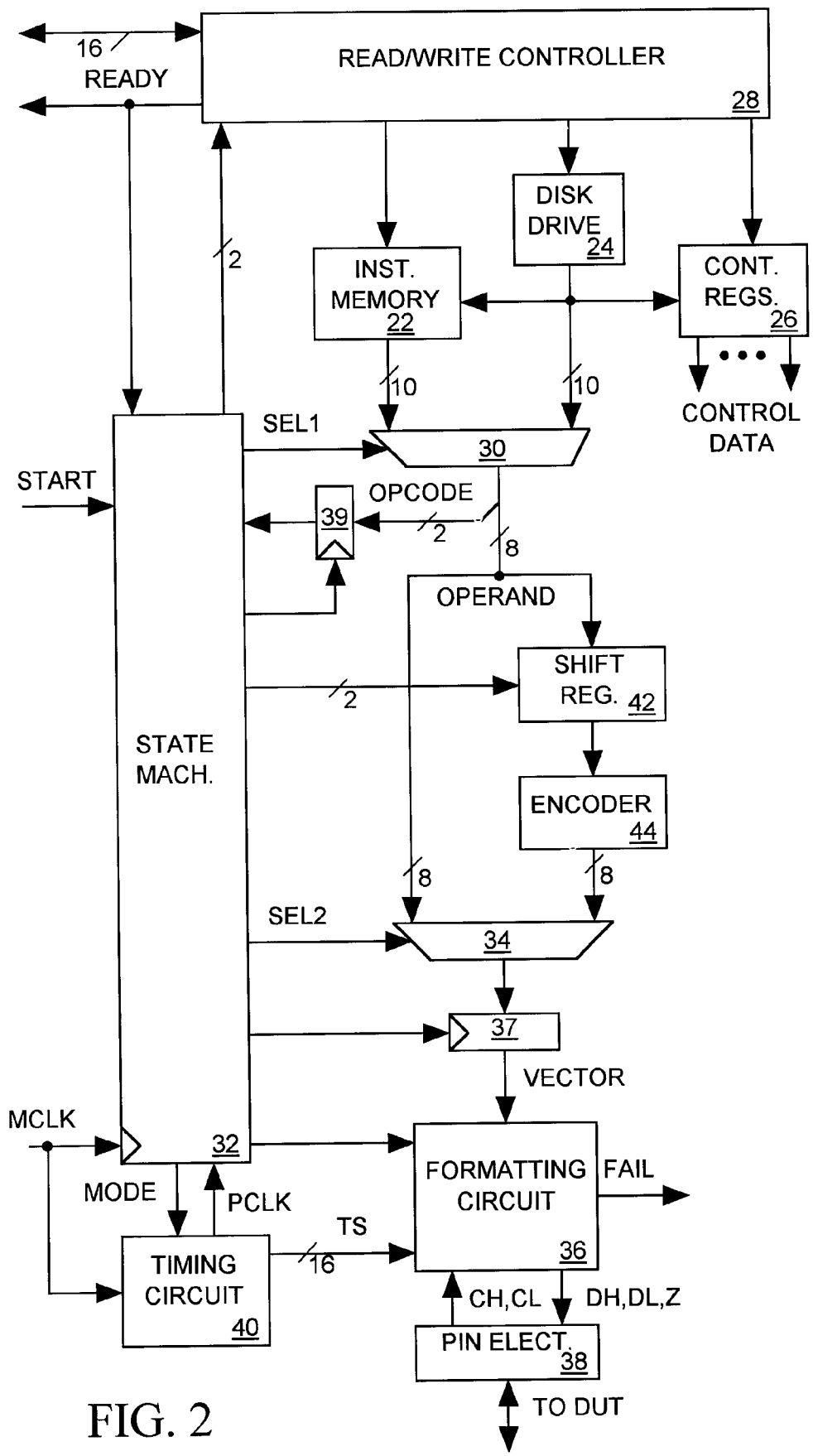

FIG. 1 depicts in block diagram form an integrated circuit tester in accordance with the present invention, and FIG. 2 depicts in block diagram form a typical channel of the tester of FIG. 1.

DESCRIPTION OF THE PREFERRED EMBODIMENT(S)

Tester Architecture

FIG. 1 depicts in block diagram form an integrated circuit (IC) tester 10 in accordance with the present invention. Tester 10 includes a set of N tester channels CH(1)–CH(N) each for carrying out test activities at a separate terminal of an IC device under test (DUT) 12. A test is organized into a succession of test cycles, and during each test cycle each channel CH(1)–CH(N) may either drive a DUT input signal to a particular state or sample a DUT output signal to determine its state. Tester 10 includes a host computer 14 connected to channels CH(1)–CH(N) through a computer bus 16 and a control signal bus 18. For each test to be performed, host computer 14 transmits a set of program instructions to each channel CH(1)–CH(N) via a bus 16 and each channel stores those instructions internally. Each channel CH(1)–CH(N) may store instructions for more than one test. When not performing a test, all channels CH(1)–CH(N) pull down on a READY line of control bus 18. To initiate a test, host computer 14 sends a command to each channel CH(1)–CH(14) via computer bus 16 indicating the disk storage location of the instructions for the particular test to be executed. Each channel CH(1)–CH(N) then configures itself to carry out the test in accordance with those instructions, and then releases the READY line. When all channels CH(1)–CH(N) are ready to perform the test and have released the READY line, the READY line goes high and host computer 14 responds by pulsing a START signal line of control bus 18 to concurrently tell all channels CH(1)–CH(N) to begin the test.

Each channel CH(1)–CH(N) then begins executing its stored test instructions and carrying out the test activities indicated by the instructions. A system clock generator 20 supplies a master clock signal (MCLK) to all channels to synchronize timing of activities during the test. Instructions executed by channels CH(1)–CH(N) that provide test signal inputs to the DUT 12 tell the channels how and when to change the state of their output test signals during each test cycle. The instructions executed by channels CH(1)–CH(N) that monitor DUT output signals indicate expected values of those signals for each test cycle. During each test cycle each channel CH(1)–CH(N) monitoring a DUT output signal samples the output signal to determine its state and pulses a FAIL signal line of control bus 18 to inform host computer 14 when the DUT output signal state does not match its expected state. When the test is complete, each channel CH(1)–CH(N) signals host computer 14 by pulling down on the READY line.

FIG. 2 illustrates tester channel CH(1) in more detailed block diagram form. Channels CH(2)–CH(N) are similar. Referring to FIG. 2, channel CH(1) includes a random access instruction memory 22, a disk drive 24, a set of control registers 26, and a read/write controller 28 accessing memory 22, disk drive 24 and control registers 26. Host computer 14 accesses controller 28 through computer bus 16 to write one or more test instruction sets into various locations of disk drive 24 in a conventional manner. Each instruction set includes all of the instructions needed to define the channel's test activities at the DUT terminal during a test. Each instruction file stored in disk drive 24 may include instructions to be written into sequential addresses of instruction memory 22 before the test begins so that they may be read out of instruction memory 22 and executed during the test. Each instruction set stored in disk drive 24 may also include instructions to be directly read out of disk drive 24 and executed during the test.

Each instruction set stored in drive 24 also includes a block of control data to be written into control registers 26 before the start of the test for controlling various channel operating parameters during the test. When host computer 14 of FIG. 1 sends a command to controller 28 via bus 16 identifying one of the instruction sets stored in disk drive 24, controller 28 first transfers the block of control data included in the instruction set from disk drive 24 into control registers 26. One of the control data values in registers 26 tells controller 28 how many instructions of the set are to be written into instruction memory 22. Controller 28 responds to that control data by transferring the indicated number of instructions from disk drive 24 into instruction memory 22. Controller 28 then addresses the first storage location of instruction memory 22 so that it reads out a first 10-bit instruction to an input of a multiplexer 30 and also signals disk drive 24 to read out to another input of multiplexer 30 a first 10-bit instruction of the instructions, if any, that are to be directly read out of disk drive 24 during the test. With channel CH(1) now prepared to carry out the test, controller 28 releases the READY line. When all channels CH(1)–CH(N) have released the READY line, host computer 14 of FIG. 1 pulls down the START signal to tell a state machine 32 within each tester channel to begin the test.

State machine 32 initially sets a SEL1 control input to multiplexer 30 to tell it to select the 10-bit instruction currently being read out of instruction memory 22 as the output of multiplexer 30. The 10-bit instruction output of multiplexer 30 has a 2-bit opcode providing an input to state machine 32 via a latch 39 and an 8-bit operand providing an input to a multiplexer 34. State machine 32 also initially sets a SEL2 control input to multiplexer 34 to select and deliver the 8-bit operand output of multiplexer 30 as a "vector" input to a formatting circuit 36 via a latch 37 also controlled by state machine 32. A vector is supplied to formatting circuit 36 at the start of each test cycle and that vector indicates the test activity to be carried out by the channel during the test cycle. Formatting circuit 36 controls a pin electronics circuit 38 which, during each test cycle, can set a test signal input to DUT 12 to a high, low or tristate logic state in response to a drive high (DH), drive low (DL) or tristate (Z) control signal pulse produced by formatting circuit 36. Pin electronics circuit 38 also compares the DUT output signal, if any, appearing at the DUT terminal to high and low logic levels and returns compare high (CH) and compare low (CL) signals to formatting circuit 36 indicating the results of the comparison.

The vector input to formatting circuit 36 may tell it to pulse one of its DH, DZ or Z signals at some particular time during the next test cycle to tell pin electronics circuit 38 to change the state of its test signal output. Alternatively, the vector may indicate expected states of the CH and CL signals and tell formatting circuit 36 to determine the states of the CH and CL signals at some particular time during the next test cycle. Formatting circuit 36 asserts the FAIL signal if it finds the states of the CH and CL signals are not as expected. A timing circuit 40, using the MCLK signal as a timing reference, supplies formatting circuit 36 with a set of 16 timing signals TS that are distributed in phase so as to divide each test cycle into 16 time slots. The vector input to formatting circuit 36 indicates a particular time slot in which an action is to be carried out during the next test cycle by referencing one of timing signals TS. Formatting circuit 36 then uses that timing signal to trigger the action. Timing circuit 40 also supplies a periodic clock signal PCLK to state machine 32, each pulse of which marks the start of a test cycle. Before each PCLK signal pulse, state machine 32 delivers a vector to the input of formatting circuit 36 and in response to each PCLK signal pulse, it signals formatting circuit 36 to acquire that vector and carry out the test activity indicated by the vector during the following test cycle.

Before host computer 14 of FIG. 1 initially asserts the START signal, state machine 32 delivers the 8-bit operand of the instruction stored at the first address of instruction memory 22 to latch 37 and then signals latch 37 to latch that operand onto the input of formatting circuit 36. State machine 32 also signals a latch 39 to latch the 2-bit opcode of that first instruction onto one of its own inputs. State machine 32 then signals controller 28 to increment the address of instruction memory 22 so that it reads out its next instruction.

The 2-bit opcode providing input to state machine 32 tells it where to obtain the next instruction to be executed. The four possible opcode values, and the response of state machine 32 to each opcode value are discussed below.

Opcodes

An instruction opcode value of "00" tells state machine 32 to obtain the next vector from the operand of the instruction currently being read out of instruction memory 22. This opcode tells state machine 32 to set the SEL1 and SEL2 signals so that multiplexers 30 and 34 pass the operand of the current output instruction of memory 22 to the input of latch 37. On the next PCLK pulse, state machine 32 signals formatting circuit 36 to acquire the vector currently at the output of latch 37 and then signals latch 37 to latch the vector at its input onto its output so that it will be available to formatting circuit 36 at the start of the next test cycle. State machine 32 also signals latch 39 to latch the operand of that next instruction onto the state machine input to tell it how to find the next instruction.

An instruction opcode value of "0" tells state machine 32 to obtain the next vector from the operand of a 10-bit instruction currently being read out of disk drive 24. State machine 32 responds to that operand by signaling multiplexers 30 and 34 to route the operand output of disk drive 24 to the input of latch 37. Thereafter, in response to the next PCLK pulse, after signaling formatting circuit to acquire the vector at the output of latch 37. State machine 32 then latches the operand output of disk drive 24 onto the input of formatting circuit 36 and signals controller 28 to make disk drive 24 read out a next instruction.

An instruction opcode value of "01" tells state machine 32 that next instruction is to be obtained from instruction memory 22 and that the vectors for the next 8 test cycles are to be obtained by successively encoding each of the 8 bits of the operand of the that instruction memory 22 output instruction. The 8-bit operand output of multiplexer 30 is provided to an input of a parallel-in/serial-out shift register 42. When the opcode of the instruction for the current test cycle is "01", state machine signals multiplexer 30 to deliver the operand of the instruction output of memory 22 to shift register 42 and signals shift register 42 to load that operand. Thereafter shift register 42 delivers the first bit of the operand as input to an encoder 44. Encoder 44 produces one of two 8-bit vector values as output depending on the state of its input bit (SERIAL_BIT). Control data in control registers 26 indicate the two vector values. On receiving the first bit of the operand loaded into shift register 42, encoder 44 delivers a vector to an input of multiplexer 34. State machine 32 signals multiplexer 34 to pass that vector to the input of latch 37. On the next PCLK pulse, state machine 32 signals latch 37 to deliver the vector to formatting circuit 36 and then signals shift register 42 to shift out a next bit of its stored operand to encoder 44. Encoder 44 then encodes that bit to supply latch 37 with a vector for the next test cycle. This process is repeated for each bit of the operand loaded into shift register 42 so that encoder 44 produces a total of eight vectors for each of eight successive test cycles. At that point state machine 32 looks at the opcode that accompanied that operand to determine the source of the vector for the next test cycle and obtains that instruction.

Control data stored in control registers 26 can also tell shift register 42 to shift either 2 or 4 bits of operand data to encoder 44 during each test cycle instead of 1. In such case, control data input to encoder 44 relates each of the four or sixteen possible input bit values to a separate output vector value. When two or four bits are used, shift register 42 and encoder 44 can chose from a wider range of vector values, but can produce vectors at a rate that is only four or two times the rate instruction memory 22 or disk drive 24 can read out instructions. The control data also tells state machine 32 how many test cycles to wait after loading an operand into shift register 42 before obtaining a next instruction.

An instruction opcode of "11" tells state machine 32 to load the operand of the current output of disk drive 24 into shift register 42 and to thereafter obtain the vectors for the next two, four or eight test cycles by causing shift register 42 to supply bits of that operand to encoder 44 in the manner described above in connection with opcode "01".

Test Cycle Frequency

Timing circuit 40 sets the test cycle frequency by setting the frequency of the PCLK signal. During a test, timing circuit may set the PCLK signal to any one of four frequencies indicated by control data from control registers 26. The particular one of four test cycle frequencies timing circuit 40 uses at any given time during a test is selected by a 2-bit MODE data input from state machine 32. State machine 32 sets the MODE data according to the manner in which it is currently obtaining vectors. Instruction memory 22 is capable of reading out instructions at a relatively high rate whereas disk drive 24 is capable of reading out instructions at a relatively low rate. Each instruction read out of instruction memory 22 or disk drive 24 can provide a single vector if routed directly to formatting circuit 36 or up to eight vectors if routed though shift register 42 and encoder 44. Since shift register 42 and encoder 44 are capable of converting each instruction output of memory 22 or disk drive 24 into up to eight vectors, they can effectively increase the vector delivery rate by a factor of up to eight. Thus the maximum rate at which vectors can be supplied to formatting circuit depends on whether instructions are obtained from memory 22 or from disk drive 24 and on whether the operands of those instructions are delivered as single vectors directly to formatting circuit 36 or are routed through shift register 42 and encoder 44. The MODE data input to timing circuit 40 allows state machine 32 to change the test cycle period on the fly during the test depending on vector source. Examples of various types of tests that make use of this capability are described below.

Scan Testing

Tester 10 is adapted for testing DUTs of the type having in addition to a set of logic signal input and output terminals, a set of "scan" terminals enabling the tester to ascertain states of internal DUT nodes not otherwise accessible via normal DUT output terminals. When tester 10 supplies an appropriate serial data sequence to one of the DUT's scan terminals, while holding normal DUT logic signal input and output terminals at fixed states, the DUT produces an output data sequence at another of its scan terminals indicating the current states of various internal DUT nodes. When tester 10 tests a DUT having scan terminals, there are two types of test cycles. During "logic test" cycles, the tester channels that access normal DUT input/output terminals stimulate the DUT with test signals and monitor its output signal to determine its response. Tester channels that access scan terminals are idle in that they do not actively supply input scan data to the DUT or monitor output scan data produced by the DUT. During "scan" cycles, the tester channels that access normal terminals are idle while the tester channels accessing the scan terminals supply input scan data to DUT 14 or acquire output scan data from the DUT. Typically scan cycles can be carried out at a lower frequency then logic test cycles. Thus during a test, instruction memory 22 may supply instructions for logic test cycles at a high rate, while disk drive 24 supplies instructions for scan test cycles at a relatively low rate. The MODE data input to timing circuit 40 tells it to slow down the PCLK signal during scan cycles to a rate at which disk drive 24 can supply the necessary instructions. By obtaining many of the instructions needed during a test directly from disk drive 24, the tester channel can carry out tests requiring substantially more instructions than it can stored in instruction memory 22.

Programmable Logic Device Testing

Tester 10 is also adapted for testing programmable logic devices (PLDs) such as programmable gate arrays having in addition to a set of input and output terminals, one or more programming input terminals. Tester channels accessing DUT programming terminals supply data to the DUT to program it to perform a particular set of logic operations.

Thereafter tester channels accessing the DUT's logic signal input and output terminals test the DUT's logic. A test may therefore include programming cycles during which programming data may be supplied to the DUT's programming input terminal(s) at a relatively low rate, and logic test cycles during which the DUT's logic is tested at a higher frequency. During a test, instruction memory 22 supplies instructions for logic test cycles at a high rate, while disk drive 24 supplied instructions for DUT programming cycles at a relatively low rate.

Low Frequency Testing

When DUT 12 is to be tested at a sufficient low frequency, disk drive 24 can directly provide all of the instructions needed for the test. Since inexpensive disk drives can have a very large storage capacity, tester 10 is capable of carrying out long, low frequency tests without requiring a large, expensive instruction memory in each channel.

Frequency Multiplication

As discussed above, shift register 42 passes bits of a stored operand to encoder 44 during successive cycles of a test. Thus when instruction operands read out of memory 22 or disk drive 24 are routed though shift register 42 and encoder 44, encoder 44 can produce vectors at a rate up to eight times faster than instruction are read out of memory 22 or disk drive 24. This increases the frequency with which the DUT can be tested by a factor of up to eight.

Instruction Set Compression

In most cases the vector sequence supplied to formatting circuit 36 contains only a relatively few different vector values. For example if tester channel CH(1) is to provide a periodic clock signal to the DUT during the entire test, the vector sequence input to formatting circuit 36 may simply alternate between two vector values. Even when channel CH(1) is to provide a relatively complex logic signal input to the DUT, most of the vectors of the vector sequence defining that signal pattern will typically be of two or four values. In long high-speed tests, where the instruction memory 22 is not large enough to store a separate instruction for each test cycle, sets of up to 2, 4 or 8 "single" vector instructions can be replaced with a single instruction routed though shift register 42 and encoder 44. Thus when a test requires only a relatively few types of vectors, shift register 42 and encoder 44 allow the instruction set defining the test to be compressed to a smaller size so that can fit in instruction memory 22.

Control Data

The control data in registers 26 tells timing circuit 40 the four possible frequencies to which it may set the PCLK signals in response to the four possible values of MODE data from state machine 32. The control data tells pin electronics circuit 38 how to respond to each vector data value and indicates the high and low logic levels of the test signal it may be commanded to produce and of the DUT output signal it monitors. The control data tells state machine 32 and shift register 42 how many bits of the operand are to be shifted out of register 42 for each test cycle and tells encoder 44 how to set output vector values for each combination of its input bits. One of control registers 26 stores data indicating the number of instructions to be executed during the test. Controller 28 counts the number of instructions reads out of instruction memory 22 and disk drive 24 during the test, and when the count reaches the value stored in the control register, controller 28 pulls down the READY control line to tell host computer 14 that the test is complete. The READY signal also resets state machine 32.

Thus has been described an IC tester 10 having a separate channel CH(1)–CH(N) for accessing each terminal of a DUT 12 during a test. In accordance with the invention, each channel includes a disk drive 24 for storing a set of instructions and control data for each test to be performed. Prior to the start of a test, each channel transfers the instructions needed for high-speed portions of the test from its disk drive 24 to its instruction memory 22. During the test the channel obtains instructions alternatively from instruction memory 22 and disk drive 24 depending on the rate at which they are needed. Each instruction operand can be used to directly provide a vector controlling channel test actions during a test cycle or can be converted to multiple vectors by shift register 42 and encoder 44 for controlling channel test activities during two, four or eight test cycles. The flexible channel architecture allows test programmers to make efficient use of limited high-speed instruction memory capacity and to program the tester to carry out tests that require more instructions than can be stored in the instruction memory. The use of a separate disk drive in each channel for storing instructions for more than one test, allows tester 10 to more quickly reconfigure itself between tests of differing types than prior art testers having channels that must be reprogrammed between tests from a central instruction source.

While the forgoing specification has described a preferred embodiment of the present invention, one skilled in the art may make many modifications to the preferred embodiment without departing from the invention in its broader aspects. The appended claims therefore are intended to cover all such modifications as fall within the true scope and spirit of the invention.

What is claimed is:

1. An integrated circuit (IC) tester comprising:

a source of system clock signal, and a plurality of tester channels, each receiving said system clock signal and each connected to a separate terminal of an IC for carrying out test activities at said terminal with timing of said test activities being synchronized to said system clock signal, wherein each of said tester channels comprises a disk storing instructions defining the test activities to be carried out; and control means for reading the instructions out of said disk and executing said instructions thereby carrying out said test activities.

2. The IC tester in accordance with claim 1 further comprising:

a bus, and a host computer connected to each of said tester channels via said bus for transmitting instructions to the disk of each tester channel via said bus.

3. The IC tester in accordance with claim 2 wherein said disk of each tester channel stores multiple sets of instructions, each set of instructions defining test activities for a separate test, and wherein said a host computer transmits a command via said bus to the control means of each said tester channel prior to a start of a test identifying one particular set of instructions to be read out of said disk and executed.

4. The IC tester in accordance with claim 1 wherein each tester channel further comprises a random access instruction memory, wherein prior to performing a test, said control means reads a portion of said instructions out of said disk and writes them into said instruction memory, and wherein during portions of said test, said control means reads instructions out of said instruction memory and executes them.

5. The IC tester in accordance with claim 4 wherein during other portions of said test, said control means reads instructions out of said disk and executes them.

6. The IC tester in accordance with claim 5 wherein each executed instruction includes and opcode and an operand and wherein the opcode of each executed instructions indicates whether the control means is to obtain a next instruction to be executed from said instruction memory or from said disk and wherein the operand of each instructions references at least one test activity to be carried out by said control means.

7. The IC tester in accordance with claim 6
wherein said control means includes means for converting the operand of each executed instruction into a variable number of vectors, each vector identifying a test activity to be carried out during a test cycles, and
wherein the number of vectors to which the operand of an instruction is convert is indicted by an opcode of a previously executed instruction.

8. An integrated circuit (IC) tester comprising:
a host computer;
a bus;
a plurality of tester channels, connected to said host computer via said bus, each tester channel connected to a separate terminal of an IC to be tested for carrying out a sequence of test activities at the IC terminal during a test, wherein each of said tester channels comprises
a disk for storing instructions received from said host computer via said bus, said instructions referencing test activities to be carried out at the IC terminal during said test;
an instruction memory; and
control means for reading Instructions out of said disk and writing them into said instruction memory before the start of said test, and for reading said instructions out of said instruction memory and executing them during said test, thereby carrying out test activities referenced by said instructions.

9. The IC tester in accordance with claim 8 wherein said disk of each tester channel stores multiple sets of instructions, each set of instructions defining test activities for a separate test, and wherein said a host computer transmits a command via said bus to the control means of each said tester channel prior to a start of a test identifying the particular set of instructions that define the test to be carried out.

10. The IC tester in accordance with claim 8
wherein said test includes high-speed and low-speed portions,
wherein during said high-speed portions of said test, said control means reads instructions out of said instruction memory and executes them, and
wherein during said low-speed portions of said test, said control means reads instructions out of said disk and executes them.

11. The IC tester in accordance with claim 10 wherein each executed instruction includes and opcode and an operand and wherein the opcode of each executed instructions indicates whether the control means is to read a next instruction to be executed from said instruction memory or from said disk and wherein the operand of each instruction references at least one test activity to be carried out by said control means.

12. The IC tester in accordance with claim 11
wherein said control means includes means for converting the operand of each executed instruction into a variable number of vectors, each vector identifying a test activity to be carried out during a test cycles, and
wherein the number of vectors to which the operand of an instruction is converted is indicted by an opcode of a previously executed instruction.

13. The IC tester in accordance with claim 8
wherein the disk of each channel also stores control data with said instructions,
wherein each channel also includes control registers,
wherein said control means of each channel also reads said control data out of said disk and writes it into said control registers prior to a start of said test, and
wherein said control data stored in said control registers controls operating characteristics of said channel during said test.

* * * * *